United States Patent
Höglauer et al.

(10) Patent No.: US 8,169,285 B2
(45) Date of Patent: May 1, 2012

(54) SEMICONDUCTOR DEVICE WITH INTEGRATED COILS

(75) Inventors: Josef Höglauer, München (DE); Bernhard Knott, Neumarkt (DE)

(73) Assignee: Infineon Technologies Austria AG, Villach (AT)

( * ) Notice: Subject to any disclaimer, the term of this patent is extended or adjusted under 35 U.S.C. 154(b) by 850 days.

(21) Appl. No.: 11/753,684

(22) Filed: May 25, 2007

(65) Prior Publication Data

US 2008/0290992 A1    Nov. 27, 2008

(51) Int. Cl.
*H01F 5/00* (2006.01)
*H04Q 5/22* (2006.01)
*H01L 29/66* (2006.01)
(52) U.S. Cl. .......................... 336/200; 340/10.1; 257/657
(58) Field of Classification Search .................. 336/200; 334/10.1; 257/679; 340/10.1
See application file for complete search history.

(56) References Cited

U.S. PATENT DOCUMENTS

| 4,668,533 | A | 5/1987 | Miller | |
|---|---|---|---|---|
| 6,031,445 | A | 2/2000 | Marty et al. | |
| 6,634,564 | B2 * | 10/2003 | Kuramochi | 235/492 |
| 6,713,319 | B2 * | 3/2004 | Ohsumi | 438/108 |
| 7,365,628 | B2 * | 4/2008 | Sato et al. | 336/200 |
| 7,642,916 | B2 * | 1/2010 | Phipps et al. | 340/572.7 |
| 2003/0030533 | A1 | 2/2003 | Waffenschmidt | |
| 2007/0020969 | A1 * | 1/2007 | Yungers | 439/77 |
| 2007/0229281 | A1 * | 10/2007 | Shionoiri et al. | 340/572.7 |

FOREIGN PATENT DOCUMENTS

WO   2005038916   4/2005

* cited by examiner

*Primary Examiner* — Anh Mai
*Assistant Examiner* — Ronald Hinson
(74) *Attorney, Agent, or Firm* — Dicke, Billig & Czaja, PLLC

(57) ABSTRACT

A semiconductor device with a number of integrated coils is disclosed. In one embodiment, a first coil portion and a second coil portion are at least in part overlapping each other. Another embodiment provides a process for manufacturing a semiconductor device having at least the processes of generating a first coil portion, generating a second coil portion, wherein at least a part of the first coil portion and a part of the second coil portion are overlapping each other.

26 Claims, 3 Drawing Sheets

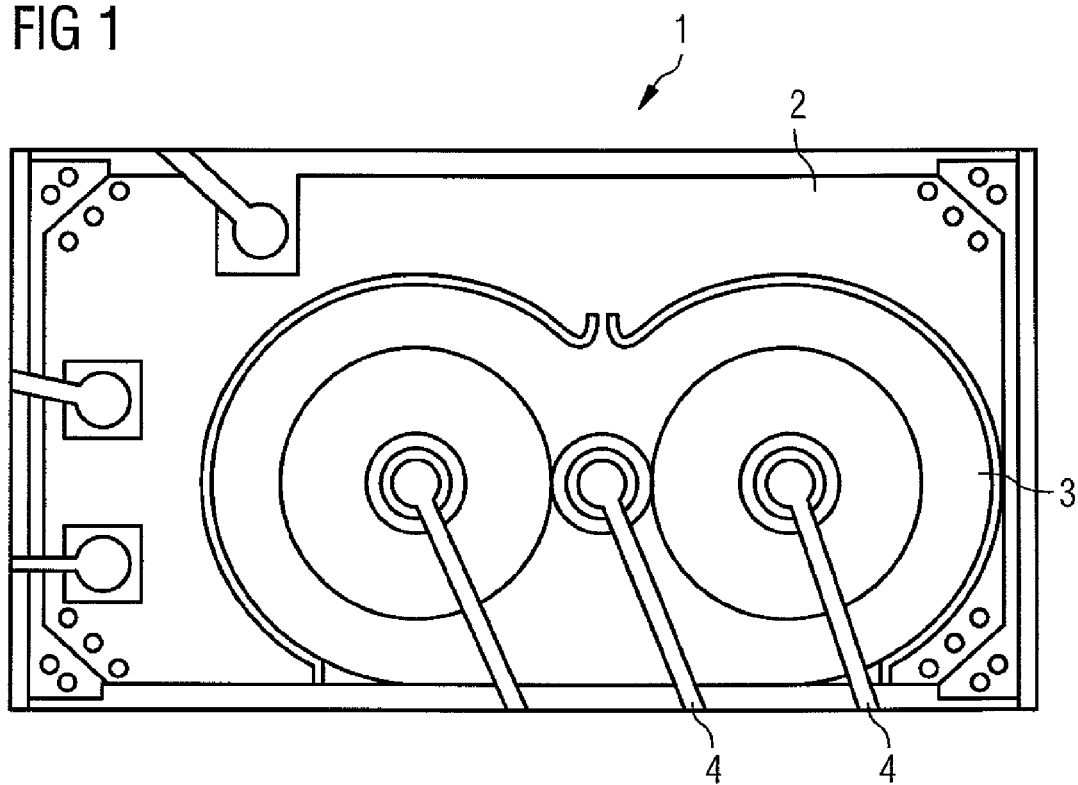

SEMICONDUCTOR DEVICE WITH INTEGRATED COILS

BACKGROUND

The present invention refers to semiconductor devices with integrated coils and to a method for manufacturing semiconductor devices with integrated coils.

There exist semiconductor devices or chips capable of wireless radio frequency communication of data with outer devices. A known example of such radio frequency communicating semiconductor devices are so called Radio Frequency Identification (RFID) transponder, chips, labels or tags. An RFID label or tag is basically an RFID transponder that is embedded with an integrated circuit and an antenna. These wirelessly communicating RFID devices are usually equipped with integrated coils for providing a wireless data communication and/or wireless electrical power transmission from external sources to internal circuits of the semiconductor device.

The integrated coils can be used as a radiating element to wirelessly exchange data between the semiconductor device and outer devices. Furthermore, the integrated coils can be used for wireless electrical power transmission. This is achieved in an inductive manner, wherein an electromagnetic field generated by an external device causes an electric current in the coils integrated in the semiconductor device. The current produced by the integrated coils is then provided to the integrated circuits of the semiconductor device or other power consuming elements of the RFID chip or tag.

An RFID tag couples a radiating element, which may include a coil or antenna, to an integrated circuit without a physical conductor. The integrated circuit can be affixed to a substrate having the antenna in such a way that the circuit chip coil is inductively coupled to the antenna coil. When the RFID tag is excited via the antenna to an external electromagnetic field, the inductive coupling between the antenna and the external electromagnetic field can cause both signaling and power to couple from the antenna to the circuit chip coil without a physical conductor connecting the antenna to the RFID tag integrated circuit.

The integrated circuit of an RFID tag can be encrypted with a unique electronic product code that may identify the tagged item from any other item. When a tag comes within the range of an RFID reader, proprietary information can be passed on through an antenna to the reader, which then can feed the data to a central computer for processing.

There are active and passive RFID tags known. Passive RFID tags receive their power for operation from the external magnetic field and the current it induces into the integrated coil in the RFID tag. Active RFID tags may include internal power sources, e.g., batteries or accumulators to provide power supply for operating the power consuming elements of the RFID tag. Inductive RFID tags are powered by the magnetic field produced by a reader. The tag's antenna picks up magnetic energy, and the tag interacts with the reader. The tag then adjusts the magnetic field for retrieving and transmitting data back to the reader, and the reader directs that data to the host computer.

There exist two types of passive RFID tags, namely inductively coupled RFID tags, and capacitively coupled RFID tags. An inductively coupled RFID tag usually includes three parts, namely silicon microprocessor, metal coil, and encapsulating material. Silicon microprocessor chips differ in size, depending on their purpose.

A metal coil can be made, for instance, of copper or aluminum wire, wound into a circular pattern on a transponder, and acts as the tag's antenna. The RFID tag sends out signals to a reader, whereas the read distance depends on the size of the coil antenna. The elements of an RFID tag can be molded into an encapsulating material, e.g., some polymer material or glass that wraps around the chip and coil.

Capacitively coupled RFID tags have been manufactured in order to reduce the cost of radio-tag systems. These tags get rid of metal coil and utilize a little quantity of silicon to accomplish the same function as that of an inductively coupled tag. A capacitively coupled tag also has three components, namely silicon microprocessor, conductive carbon ink, and paper. A capacitively coupled tag can store a number of bits of information that would allow for a large amount of distinct numbers, and these numbers can be assigned to goods.

Conductive carbon ink is a special ink that can act as the tag's antenna. This ink is applied to the paper substrate by using usual printing techniques. A silicon chip can be affixed to printed carbon-ink electrodes on the back of a paper label, to create an inexpensive, disposable tag that can be integrated on conventional product labels.

In previous RFID semiconductor devices or chips integrated coils require substantial space on the chip and therefore cause large size of the RFID semiconductor devices and correspondingly additional costs to the production. In previous solutions, e.g., in a device known as SPT5 CT, the coils are implemented as concentric spirals by using metal lines in back-end-of-line (BEOL) applications. In such known devices the coils contribute to the required chip area with more than 50%.

Parts of a semiconductor device 1 with integrated coils 3 according to the state of the art is shown in FIG. 1. In this prior art semiconductor device 1 the chip area 2 has a square shape, and the integrated coils 3 are designed as a coil pair with circular shaped areas. The integrated coils 3 are contacted via electrical connections 4 to apply electrical voltage pulses to the coils for wireless data transmission or to gather inductively induced current from the coils 3 to provide power to the power requiring elements of the device. In this known device the integrated coils are arranged in one layer adjacent to each other and cover a bigger part, i.e. more than half of the chip area 2.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

FIG. 1 illustrates a part of a semiconductor device with integrated coils according to the state of the art as already discussed above in the present description.

DETAILED DESCRIPTION

Figure 2A:
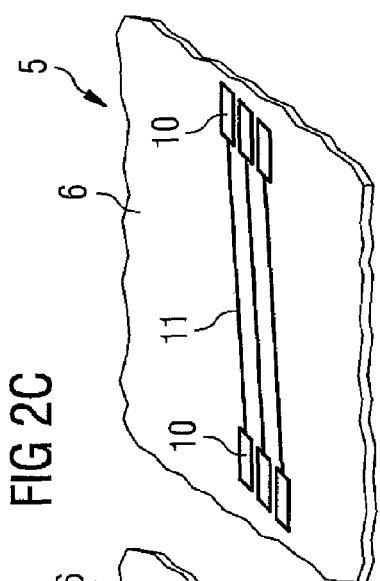
FIGS. 2A, 2B and 2C illustrate parts of embodiments of a semiconductor device with integrated coils in a perspective view.

In the following Detailed Description, reference is made to the accompanying drawings, which form a part hereof, and in which is illustrated by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

The present invention aims to reduce the required chip area for integrated coils in such semiconductor devices. The present invention targets to provide semiconductor devices with integrated radiating elements or antennas which require less chip area. The present invention is further aimed to provide a method for producing such semiconductor devices.

In terms of a basic concept the present invention provides a semiconductor device with a number of integrated coils which are at least in part overlapping each other. The integrated coils can be at least in part positioned in different layers of the semiconductor device vertically arranged to each other. The integrated coils can be at least in part substantially in parallel alignment to each other. By this vertical arrangement of the coils in the chip it is possible to reduce the required chip area and thus also the production costs of the device.

The suggested vertical arrangement of the integrated coils can reduce the space requirement of the chip and additionally enable the realization of an increased number of windings of the integrated coils at lower production costs. Furthermore, an augmentation of the coil inductance can be achieved. An augmentation of the coil inductance can be advantageous, for instance, in connection with the utilization of the so called coreless technology for power transmission.

In the present context the term 'semiconductor device' indicates the device as a whole which may include a substrate, a number of integrated circuits or chips, an assembly of electronic components and one or more integrated coils. The term 'integrated coil' means in the present context any coil integrated in the device and coupled to the electronic components and/or coupled to the integrated circuits or chips of the device.

According to another embodiment, the present invention can provide a merit consisting in the vertical arrangement of the coil windings in different layers with a division of conductor paths or lines of the coils in a portion realized at least partly on a chip of the semiconductor device and a portion realized at least partly on a chip carrier of the semiconductor device, respectively. In one embodiment, a portion of the integrated coil may be at least partly arranged in a layer of a chip of the semiconductor device and another portion of the integrated coil may be at least partly arranged in a layer of the chip carrier or substrate of the semiconductor device, respectively.

According to another embodiment, the coil windings may include a division of conductor paths or lines of the coils in a portion extending at least partly across the chip of the semiconductor device and a portion extending at least partly across the chip carrier of the semiconductor device, respectively. In another embodiment, at least a portion of the coil windings may extend across the entire chip of the semiconductor device and at least a portion of the coil windings may extend across the chip carrier of the semiconductor device. The coil portions may be part of one integrated coil or belong to different integrated coils of the semiconductor device, respectively.

In one embodiment, the conductor lines or lines of the integrated coils may be realized by using wire bonds. In another embodiment, the conductor paths or lines of the integrated coils may be printed conductor paths. The printed conductor paths can be generated by using conductive ink, like carbon ink, silver ink or copper ink. The conductor paths can be generated by using the conductive ink printed on a chip of the semiconductor device. Alternatively or in addition, the conductor paths can be generated by using conductive ink printed on a chip carrier or substrate of the semiconductor device.

In yet another embodiment, the windings of the integrated coils may be structured as conductor paths. The structured conductor paths can be generated by using respective manufacturing processes producing the required structure during the process for manufacturing the semiconductor device. The printed or structured conductor paths can be implemented as isolated conductor paths.

According to another embodiment, a lower portion of an integrated coil and an upper portion of the integrated coil provide a coil pair. One aspect of the present invention is directed to the designing of the lower portion of the integrated coil. A lower portion of the integrated coil may be positioned on a chip carrier of the semiconductor device. According to another embodiment of the present invention, at least one coil winding of the lower portion of the integrated coil is extending across the chip carrier of the semiconductor device. The portions of the integrated coil may be designed as an isolated printed conductor path, as a structured lead frame, or as a pre-structured adhesive foil. The adhesive foil can be pre-structured and arranged on the chip and/or on the chip carrier of the semiconductor device.

Another aspect of the present invention is directed to the designing of the upper portion of the integrated coil. The upper portion of the integrated coil may be positioned on the chip of the semiconductor device. The upper portion of the integrated coil may be realized by using conventional interconnect technology, whereas the lower portion may be realized as a structured substrate. This arrangement provides coil pairs with an upper portion and a lower portion. Such coil pairs may be arranged as two separate coil pairs, or as a bifilar coil. The upper and/or the lower part of the integrated coils may be realized by using isolated bonding wires. According to another embodiment of the present invention, at least one coil winding of the upper part of the integrated coil is extending across the chip of the semiconductor device.

The lower coil portion may be printed onto a chip carrier or substrate of the semiconductor device by using printing technology. The upper coil portion may be printed onto a chip of the semiconductor device. Alternatively or in addition, the upper coil portion may also be printed onto a substrate or chip carrier of the semiconductor device. The printing of the upper and/or the lower coil portions may be performed by using an ink jet printer printing conductive lines onto the chip carrier and/or onto a chip of the semiconductor device. Furthermore, one or more isolating layers can be printed onto the chip carrier and/or onto a chip of the semiconductor device to provide an isolating or dielectric layer between coil portions, e.g., in the case of bifilar coils.

The upper and/or the lower portion of the integrated coil can be generated after the mounting of chips onto the substrate or chip carrier or substrate of the semiconductor device. The mounting of one or more chips onto the substrate or chip carrier of the semiconductor device may be performed by using an adhesive material or glue. The mounting of the chips onto the substrate or chip carrier of the semiconductor device may be performed by forming chamfers made of the adhesive material or glue at sidewalls of the chip.

According to another embodiment, the integrated coil pairs may be fabricated on the semiconductor device by applying the upper coil portion by deposition of metallization on the front side of the substrate or chip carrier, and the lower coil portion by a structured metallization on the rear side of the substrate or chip carrier of the semiconductor device.

The connection between conductive lines on the front and rear sides of the substrate or chip carrier of the semiconductor device can be established by trench etching and subsequent filling of the trenches with conductive material or ink during the front-side process. The integrated coil may include printed conductive ink electrodes for contacting the upper and/or lower portion of the coil. The substrate or chip carrier of the semiconductor device may include pads for contacting the upper and/or lower portion of the coil. The pads may be contacted by bonding wires, and the bonding wires may provide at least a part of the upper and/or lower portion of the coil.

According to yet another embodiment, a number of semiconductor devices may be fabricated in parallel in a front-side process and may be separated in a back-end process. For manufacturing semiconductor devices in parallel, the semiconductor devices may be fabricated on a common substrate. The separation of semiconductor devices fabricated on a common substrate may be performed by dicing, e.g., by cutting or sawing the common substrate in respective parts, and thereby separating the semiconductor devices from each other.

Figure 2B:
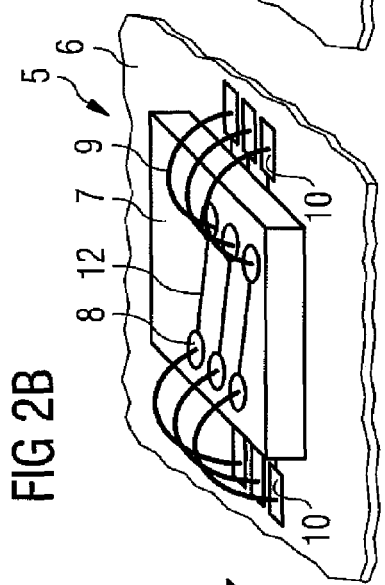
Figure 2C:
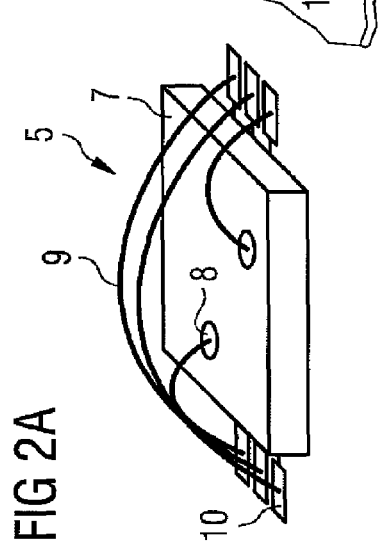
Figure 3C:
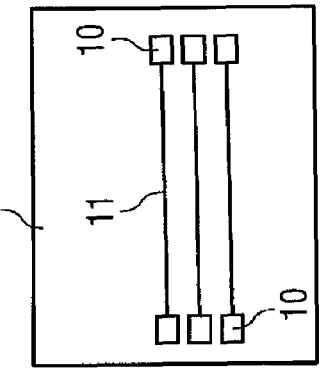
FIGS. 3A, 3B and 3C illustrate parts of embodiments of a semiconductor device with integrated coils in a plan view.
Figure 3B:
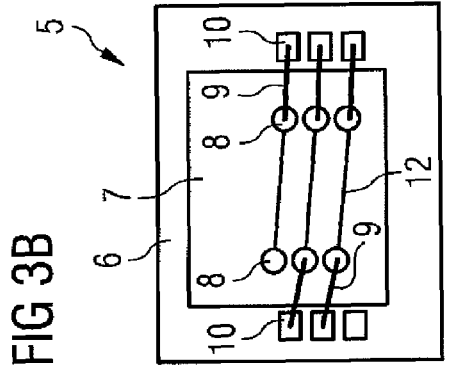
Figure 3A:
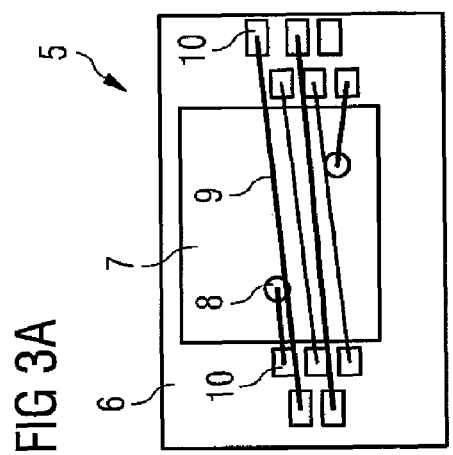

In FIGS. 2A, 2B and 2C parts of different embodiments of a semiconductor device with integrated coils are illustrated in a perspective view. In FIGS. 3A, 3B and 3C the embodiments of semiconductor devices illustrated in FIGS. 2A, 2B and 2C are depicted in a plan view, respectively. In the drawings identical reference numerals have been used to indicate the same or equivalent components of the device.

From the embodiments of a semiconductor device 5 with integrated coils illustrated in FIGS. 2A, 2B and 2C it can be seen that the integrated coils 11 and 12 of the semiconductor device 5 are at least in part overlapping each other. In other words, the integrated coils 11, 12 are at least in part substantially in parallel alignment and vertically arranged to each other.

In particular from FIGS. 2B and 2C it can be seen that the coil of the semiconductor device includes a first coil portion 11 and a second coil portion 12 which are at least partly arranged in different layers of the semiconductor device. Referring to FIG. 2B at least a part of the first coil portion 11 is arranged in a first layer and at least a part of the second coil portion 12 is arranged in a second layer, wherein the first and second layer are in a vertical arrangement.

The embodiment of the semiconductor device 5 illustrated in FIG. 2B includes a substrate or chip carrier 6, and a chip 7 is arranged on the top surface of the substrate or chip carrier 6. The substrate or chip carrier 6 includes pads 10 to provide electrical contacts for integrated coils 11, 12 of the semiconductor device 5. Furthermore, the chip 7 includes pads 8 to provide electrical contacts for the integrated coils 11, 12 of the semiconductor device 5.

The coil windings of the integrated coil are divided in conductor paths of a lower coil portion 11 illustrated in FIG. 2C and an upper coil portion 12. The lower coil portion 11 is realized on substrate or chip carrier 6, and the upper coil portion 12 is realized on the top surface of the chip 7 of the semiconductor device 5, respectively. As to be seen in the plan view of FIGS. 3A, 3B and 3C, the coil windings or conductor paths of the lower coil portion 11 are extending at least partly across the chip 7 and the coil windings or conductor paths of the upper coil portion 12 are extending at least partly across the chip substrate or chip carrier 6 of the semiconductor device 5, respectively.

In one embodiment illustrated in FIG. 2A, the coil windings of the integrated coils may be realized by using bonding wires 9. Turning to the embodiment illustrated in FIG. 2B, the coil windings of the integrated coils may be realized only in part by using isolated bonding wires 9 and in part by using conductor paths 11 and 12. The conductor paths 11 and 12 of the integrated coils may be fabricated as printed conductor paths applied onto the chip 7 or applied onto the substrate or chip carrier 6. The printed conductor paths can be generated by using conductive ink, which is described in more detail further below in this description with reference to FIGS. 4a and 4B.

The windings of the lower coil portion 11 illustrated in FIG. 2C may be structured as conductor paths applied onto the substrate or chip carrier 6 and can be generated by suitable manufacturing processes producing the structure during the process for manufacturing the substrate or chip carrier 6. The printed or structured windings of the upper or lower coil portion 11 and 12 can be implemented as isolated conductor paths. Alternatively, the lower coil portion may be implemented as a structured lead frame, or as a pre-structured adhesive foil which is applied to the chip 7 and/or the chip carrier 6 of the semiconductor device 5.

A synopsis of FIGS. 2b, 2C, 3A and 3B leads to the understanding that a complete winding of an integrated coil includes conductor paths of a lower coil portion 11 arranged on the substrate or chip carrier 6, conductor paths of an upper coil portion 12 arranged on the chip 7 and isolated bonding wires 9 connecting the conductor paths of the lower coil portion 11 and the upper coil portion 12 via the contact pads 8 and 10.

Turning to FIGS. 2A and 3A, a complete winding of the integrated coil may alternatively or in addition include conductor paths of a lower coil portion arranged on a substrate or chip carrier, and bonding wires 9 providing the upper part of the integrated coil. In the embodiment illustrated in FIGS. 2A and 3A the conductor paths of the lower coil portion are arranged underneath the chip 7 and the bonding wires 9 are crossing the chip 7 above its top side, wherein some the bonding wires 9 can be directly connected to the chip 7 via pads 8. The conductor paths of the lower coil portion and the bond wires 9 are linked via contact pads 10.

Figure 4A:
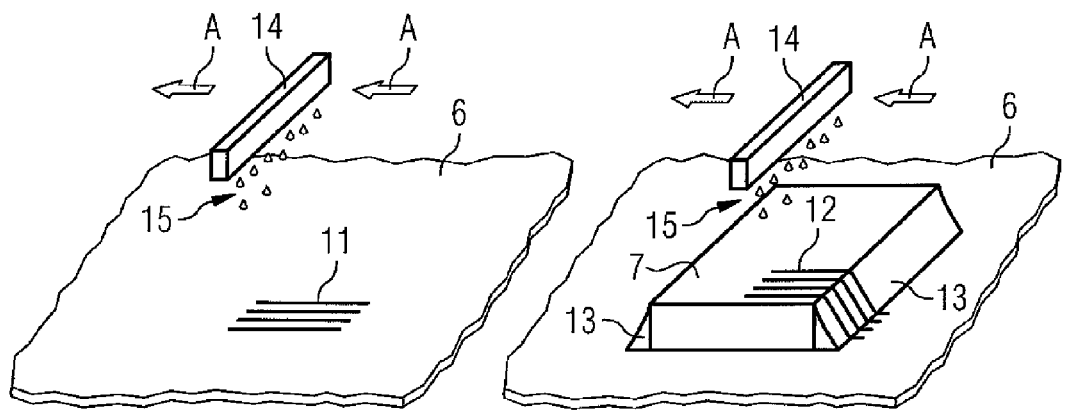
FIGS. 4A and 4B illustrate further parts of embodiments of a semiconductor device with integrated coils in a perspective view.
Figure 4B:
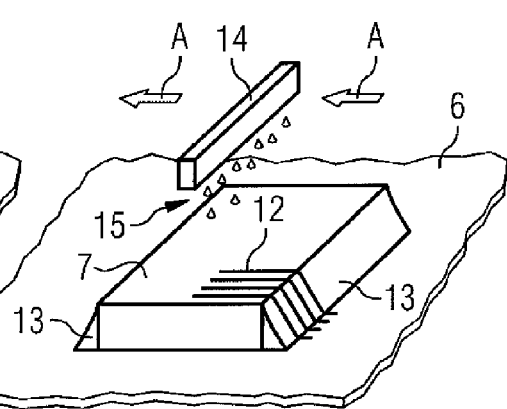

FIGS. 4A and 4B illustrate parts of further embodiments of a semiconductor device with integrated coils in a perspective view. Furthermore, FIGS. 4A and 4B illustrate steps in a manufacturing process for fabricating embodiments of a semiconductor device with integrated coils.

Turning to FIG. 4A, a substrate or chip carrier 6 is illustrated, and conductive paths of a lower coil portion 11 are printed onto the chip carrier 6 by using printing technology. Therefore, an ink jet printer 14 is moved across the top surface of the substrate or chip carrier 6 in the direction of the arrows A illustrated in FIG. 4A. While moving across the substrate or chip carrier 6 the ink jet printer 14 applies an conductive fluid 15, e.g., carbon ink, silver ink or copper ink, onto the substrate or chip carrier 6 forming conductive lines or paths of a lower coil portion 11 onto the substrate or chip carrier 6 for providing a lower part of the integrated coil of the semiconductor device 5.

As a next process, one or more chips 7 can be applied onto the substrate or chip carrier 6. With reference to FIG. 4B, the mounting of one or more chips 7 onto the substrate or chip carrier of the semiconductor 6 device can be performed by using an adhesive material or glue forming chamfers 13 on side walls of the chip 7. After mounting the chip 7 on the substrate or chip carrier 6 an upper coil portion 12 of the integrated coil may be printed by the same printing technology as used for generating of the lower coil portion 11. The generating of a lower coil portion 11 may include the forming of conductive lines or paths on the chamfers 13 at the side walls of the chip 7.

Therefore, an ink jet printer 14 is moved across the top surface of the chip 7 in the direction of the arrows A. While moving across the chip 7 the ink jet printer 14 applies a conductive fluid 15, e.g., carbon ink, silver ink or copper ink, onto the surface of the chip 7 and the chamfer 13 on the side wall of the chip 6. Thus conductive lines or paths of an upper coil portion 12 are formed onto the substrate or chip 7 for providing an upper part of the integrated coil of the semiconductor device 5. The conductive lines or paths formed on the surface of the chamfer 13 at the side wall of the chip 6 provide an electrical connection of the conductive paths of the lower coil portion 11 with the conductive paths of the upper coil portion 12.

Figure 5:
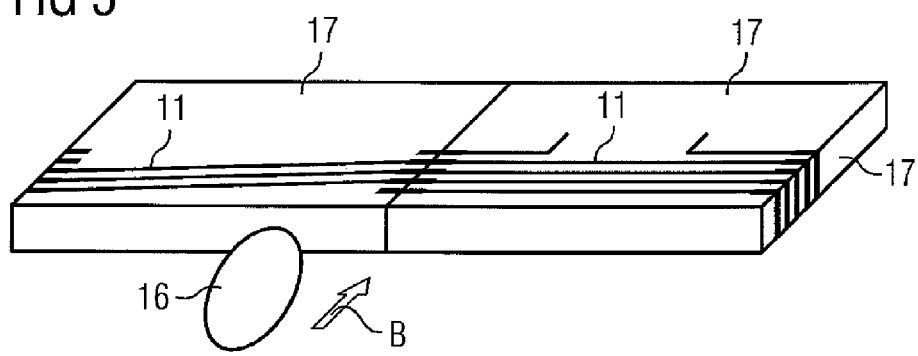
FIG. 5 illustrates parts of another embodiment of a semiconductor device with integrated coils in a perspective view.

FIG. 5 illustrates parts of another embodiment of a semiconductor device with integrated coils in a perspective view. Furthermore, FIG. 5 illustrates another process in a manufacturing process for fabricating an embodiment of a semiconductor device with integrated coils.

From FIG. 5 it can be seen that a number of semiconductor devices can be fabricated in parallel in a front-side process and afterwards separated in a back-end process. In this embodiment, the semiconductor devices are fabricated on a common substrate 17 forming conductive lines or paths 11 on the substrate 7. The generation of conductive lines or paths 11 on the substrate 7 can be performed, for instance, by using structured metallization, trench etching and filling the trenches with conductive material or by using printing technology as described above. Thereby, conductive lines or paths 11 are formed on the substrate 7 providing conductive windings for an integrated coil of the semiconductor device according to an embodiment of the present invention.

In one embodiment, conductive lines or paths 11 can be formed both on the top surface and on the rear surface of the substrate 7. Thus, the integrated coil in this embodiment of the present invention includes an upper coil portion with conductive lines 11 on the front or top side of the substrate or chip carrier 7, and a lower coil portion on the rear side of the substrate or chip carrier 7 of the semiconductor device.

After building conductive lines 11 on the front or top surface and on the rear surface of the substrate 7 a connection between the conductive lines 11 on the front side and the conductive lines 11 on the rear side of the substrate 7 can be provided by etching trenches on the edge sides of the substrate 7 and subsequent filling of the trenches with a conductive material. Thereby, the conductive lines 11 on the front or top surface, the conductive lines on the rear surface of the substrate 7 (not illustrated) and the connection lines may provide a complete integrated coil of the semiconductor device.

As a next process for manufacturing this embodiment of a semiconductor, the common substrate 17 can be separated into single substrates. This separation may be performed by dicing, e.g., by cutting the common substrate 17 in parts by using a saw 16 moving in the direction of arrow B illustrated in FIG. 5, and thereby separating the substrates 17 of the semiconductor devices from each other.

While certain configurations and arrangements of the present invention have been discussed, it should be understood that this was done for illustrative purposes only. A person skilled in the pertinent art will recognize that other configurations and arrangements can be used without departing from the spirit and scope of the present invention. It will be apparent to a person skilled in the respective art that this invention can also be employed in a variety of other applications.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device comprising:
a number of integrated coils;
a first layer;
a second layer made from a first material, the second layer comprising an upper wall and a side wall substantially perpendicular to the upper wall; and
a chamfered adhesive material different from the first material, the chamfered adhesive material in direct contact with the side wall of the second layer,
wherein a conductive line of a first coil portion is positioned on the first layer and a conductive line of a second coil portion is positioned on the upper wall of the second layer and the chamfered adhesive material, which is in direct contact with the side wall of the second layer.

2. The semiconductor device of claim 1, wherein the first coil portion and the second coil portion are part of one integrated coil.

3. The semiconductor device of claim 1, wherein the first coil portion and the second coil portion belong to different integrated coils of the semiconductor device.

4. The semiconductor device of claim 1, wherein the first coil portion and the second coil portion are positioned at least in part in different layers of the semiconductor device.

5. The semiconductor device of claim 1, wherein at least a part of the first coil portion is arranged in a first layer and at least a part of the second coil portion is arranged in a second layer, wherein the first and second layer are substantially parallel aligned and in a vertical arrangement to each other.

6. The semiconductor device of claim 1, wherein at least a part of the first coil portion is arranged on a chip of the semiconductor device and at least a part of the second coil portion is arranged on a chip carrier or substrate of the semiconductor device.

7. The semiconductor device of claim 1, wherein a number of conductor paths of the integrated coil are extending at least in part across a chip of the semiconductor device.

8. The semiconductor device of claim 1, wherein a number of conductor lines of the integrated coil are extending at least in part across a chip carrier or substrate of the semiconductor device.

9. The semiconductor device of claim 1, wherein the first coil portion and the second coil portion provide a coil pair.

10. The semiconductor device of claim 1, wherein the first coil portion provide a lower portion of an integrated coil and the second coil portion provide an upper portion of an integrated coil or the first coil portion provide an upper portion of an integrated coil and the second coil portion provide a lower portion of an integrated coil.

11. The semiconductor device of claim 1, wherein a number of windings or conductor lines of the integrated coil are realized by using wire bonds.

12. The semiconductor device of claim 1, wherein a number of conductor lines of the integrated coil are printed conductor paths made of conductive material.

13. The semiconductor device of claim 1, wherein a number of conductor lines of the integrated coil are generated by using an conductive fluid, carbon ink, silver ink or copper ink.

14. The semiconductor device of claim 1, wherein a number of conductor lines of the integrated coil are arranged on a chip of the semiconductor device.

15. The semiconductor device of claim 1, wherein a number of conductor lines of the integrated coil are arranged on a chip carrier or substrate of the semiconductor device.

16. The semiconductor device of claim 1, wherein a number of windings of the integrated coil are isolated conductor paths.

17. The semiconductor device of claim 1, wherein a number of windings of the integrated coil are structured a conductor path generated by respective manufacturing processes producing a respective structure.

18. The semiconductor device of claim 1, wherein a number of windings of the integrated coil are structured as an isolated printed conductor path made of conductive material, as a structured lead frame, and as an adhesive foil.

19. The semiconductor device of claim 18, wherein the adhesive foil is pre-structured and arranged on a chip and/or on a chip carrier or substrate of the semiconductor device.

20. The semiconductor device of claim 1, wherein the first coil portion and the second coil portion provide coil pairs arranged as two separate coil pairs, or as a bifilar coil.

21. The semiconductor device of claim 1, further comprising one of electrodes and pads for contacting the first and second coil portion.

22. The semiconductor device of claim 21, wherein the electrodes and pads are contacted by bonding wires, and the bonding wires provide at least a part of the first and second coil portion.

23. A system comprising:
   a semiconductor device having a number of integrated coils, a first layer, a second layer made from a first material and comprising an upper wall and a side wall substantially perpendicular to the upper wall, and a chamfered adhesive material different from the first material and in direct contact with the side wall of the second layer, wherein a conductive line of a first coil portion is positioned on the first layer and a conductive line of a second coil portion is positioned on the upper wall of the second layer and the chamfered adhesive material, which is in direct contact with the side wall of the second layer; and
   an integrated circuit coupled to the semiconductor device.

24. The system of claim 23, comprising:
   where the system further comprises an RFID chip.

25. The system of claim 23, comprising:
   an external device, configured to communicate with the semiconductor device via at least one of the number of integrated coils.

26. A system comprising a chip carrier, a chip comprising an upper wall and a side wall, and a chamfered adhesive material in direct contact with the side wall of the chip and extending to the upper wall, wherein a conductive line of a first coil portion is provided on the chip carrier and a conductive line of a second coil portion is provided directly on the upper wall of the chip, directly on an interface between the upper wall of the chip and the chamfered adhesive material, and directly on the chamfered adhesive material, which is in direct contact with the side wall of the chip.

* * * * *